(12) United States Patent
Rosalik, Jr. et al.

(10) Patent No.: US 12,358,373 B2
(45) Date of Patent: Jul. 15, 2025

(54) VEHICLE SYSTEMS AND LOSS OF ISOLATION DETECTION METHODS

(71) Applicant: GM GLOBAL TECHNOLOGY OPERATIONS LLC, Detroit, MI (US)

(72) Inventors: Martin E. Rosalik, Jr., Oakland Township, MI (US); Todd M. York, Highland, MI (US); Tanvi Nagarale, Rochester Hills, MI (US); Brent S. Gagas, Pleasant Ridge, MI (US); Brian A. Welchko, Oakland Township, MI (US); Wei Wang, Troy, MI (US)

(73) Assignee: GM GLOBAL TECHNOLOG OPERATIONS LLC, Detroit, MI (US)

( * ) Notice: Subject to any disclaimer, the term of this patent is extended or adjusted under 35 U.S.C. 154(b) by 144 days.

(21) Appl. No.: 18/486,585

(22) Filed: Oct. 13, 2023

(65) Prior Publication Data

US 2025/0121691 A1   Apr. 17, 2025

(51) Int. Cl.
*B60L 3/00* (2019.01)
*B60L 3/12* (2006.01)
*G01R 19/165* (2006.01)

(52) U.S. Cl.
CPC .............. *B60L 3/0069* (2013.01); *B60L 3/12* (2013.01); *G01R 19/16576* (2013.01)

(58) Field of Classification Search
CPC .... B60L 3/0069; B60L 3/12; G01R 19/16576
See application file for complete search history.

(56) References Cited

U.S. PATENT DOCUMENTS

| | | | |
|---|---|---|---|
| 7,570,008 B2 * | 8/2009 | Inaba | H02M 7/003 361/33 |
| 2022/0337070 A1 * | 10/2022 | Griffiths | B60R 16/033 |

FOREIGN PATENT DOCUMENTS

DE     102011012588 A1     1/2012

* cited by examiner

*Primary Examiner* — Gertrude Arthur Jeanglaude
(74) *Attorney, Agent, or Firm* — Lorenz & Kopf LLP (57) ABSTRACT

Vehicles and related systems and monitoring methods are provided for detecting a loss of isolation on one side of a power converter. One method involves monitoring a normalized voltage input to a power conversion module coupled to the electric motor, in response to the normalized voltage exceeding a diagnostic activation threshold, determining a first number of instances of a range between successive extremas of the normalized voltage exceeding a loss of isolation range threshold over a diagnostic window of time, and automatically initiating a remedial action when the first number is greater than a loss of isolation detection threshold.

20 Claims, 3 Drawing Sheets

VEHICLE SYSTEMS AND LOSS OF ISOLATION DETECTION METHODS

INTRODUCTION

The technical field generally relates to vehicle systems and more particularly relates to diagnostics for vehicle electrical systems.

Advances in technology have led to substantial changes in the design of automotive vehicles. In particular, electric motors (or electric machines) are finding an increasing number of applications in the automotive industry due to the electrification of the automotive drive system. Electric and/or hybrid vehicles utilize electric motors as either primary or supplemental torque sources in the automotive drive system. In electric and/or hybrid vehicles, the electric motor is typically powered by a rechargeable energy source, such as a battery, using one or more power conversion modules to produce the desired alternating current electrical signals across the stator windings of the electric motor.

Electric motors are expected to function over extreme operating conditions for an extended period of time with high reliability. However, over time, the operating stresses applied to the electric motor may degrade the condition of the stator windings or otherwise render the electric motor inoperable. For example, mechanical impacts or stresses may cause deformation of the rotor or otherwise result in a conductive object striking or contacting the stator windings and causing an intermittent loss of isolation or short-circuiting on the alternating current (AC) side. Accordingly, it is desirable to quickly detect and accurately diagnose a loss of isolation in the electric motor to prolong the useful life of electrical components, reduce maintenance downtime and maintain availability of the vehicle.

SUMMARY

Apparatus for a vehicle and related methods and vehicle systems are provided. In an exemplary implementation, a method of monitoring an electric motor in a vehicle involves monitoring, by a control module, a normalized voltage to a power conversion module coupled to the electric motor, in response to the normalized voltage exceeding a diagnostic activation threshold, determining a first number of instances of a range between successive extremas of the normalized voltage exceeding a loss of isolation range threshold over a diagnostic window of time after detecting the normalized voltage exceeding the diagnostic activation threshold, and automatically initiating a remedial action when the first number is greater than a loss of isolation detection threshold.

In one or more implementations, the method detects an alternating current (AC) loss of isolation event after verifying a respective mean value associated with a respective instance of the successive extremas of the normalized voltage is within a threshold of a normalized voltage value, wherein automatically initiating the remedial action involves automatically providing an indication of the AC loss of isolation event. In one implementation, automatically providing the indication involves the control module automatically generating a diagnostic code associated with the electric motor.

In one or more implementations, the method detects a direct current (DC) loss of isolation event when a difference between a respective mean value associated with a respective instance of the successive extremas of the normalized voltage and a normalized voltage value is greater than a threshold, wherein automatically initiating the remedial action involves automatically providing an indication of the DC loss of isolation event.

In one or more implementations, monitoring the normalized voltage involves obtaining a measured voltage for a reference node associated with a voltage bus coupled between an energy source and the power conversion module relative to a ground reference node and dividing the measured voltage by a direct current (DC) voltage associated with the energy source to obtain the normalized voltage.

In one or more implementations, the method involves extracting the instances of the successive extremas of the normalized voltage during the diagnostic window of time, wherein a respective instance of the successive extremas includes a respective maxima of the normalized voltage and a respective minima of the normalized voltage. In one implementation, the method subtracts the respective minima of the normalized voltage from the respective maxima of the normalized voltage to obtain a respective range value associated with the respective instance of the successive extremas, wherein determining the first number of instances involves incrementing a counter when the respective range value is greater than the loss of isolation range threshold. In an implementation, automatically initiating the remedial action involves automatically initiating the remedial action when a value of the counter is greater than the loss of isolation detection threshold.

In one or more implementations, monitoring the normalized voltage involves determining a midpack voltage between a node of a voltage bus coupled between an energy source and the power conversion module and a vehicle chassis ground reference voltage node, dividing the midpack voltage by a direct current (DC) voltage associated with the energy source to obtain a normalized midpack voltage, and monitoring the normalized midpack voltage. In one implementation, determining the first number of instances involves counting the first number of instances when the range between a respective pair of peak and valley values for the normalized midpack voltage is greater than the loss of isolation range threshold within the diagnostic window of time. In an implementation, automatically initiating the remedial action involves automatically providing an indication of an alternating current (AC) loss of isolation event when the first number of instances of the range between respective pairs of peak and valley values for the normalized midpack voltage is greater than the loss of isolation range threshold within the diagnostic window of time is greater than an AC loss of isolation detection threshold number.

An apparatus is also provided for a non-transitory computer-readable medium having executable instructions stored thereon that, when executed by a processor, cause the processor to provide a monitoring service configurable to monitor a normalized voltage to a power conversion module coupled to an electric motor of a vehicle, in response to the normalized voltage exceeding a diagnostic activation threshold, determine a first number of instances of a range between successive extremas of the normalized voltage exceeding a loss of isolation range threshold over a diagnostic window of time after detecting the normalized voltage exceeding the diagnostic activation threshold, and automatically initiate a remedial action when the first number is greater than a loss of isolation detection threshold.

In one or more implementations, the monitoring service is configurable to detect an alternating current (AC) loss of isolation event after verifying a respective mean value associated with a respective instance of the successive extremas of the normalized voltage is within a threshold of a normalized voltage value, wherein automatically initiating the remedial action involves automatically providing an indication of the AC loss of isolation event.

In one or more implementations, the monitoring service is configurable to detect a direct current (DC) loss of isolation event when a respective mean value associated with a respective instance of the successive extremas of the normalized voltage is greater than a normalized voltage value by more than a threshold, wherein automatically initiating the remedial action involves automatically providing an indication of the DC loss of isolation event.

In one or more implementations, the monitoring service is configurable to extract the instances of the successive extremas of the normalized voltage during the diagnostic window of time, wherein a respective instance of the successive extremas includes a respective maxima of the normalized voltage and a respective minima of the normalized voltage. In one implementation, the monitoring service is configurable to subtract the respective minima of the normalized voltage from the respective maxima of the normalized voltage to obtain a respective range value associated with the respective instance of the successive extremas, wherein determining the first number of instances involves incrementing a counter when the respective range value is greater than the loss of isolation range threshold.

A vehicle system is also provided that includes an electric motor, a direct current (DC) voltage bus including a reference voltage node, a power conversion module coupled between the DC voltage bus and the electric motor, and a control module coupled to the power conversion module to provide a monitoring service. The monitoring service is configurable to monitor a normalized voltage to the power conversion module involving a relationship between a measured voltage of the reference voltage node and a DC voltage associated with the DC voltage bus, in response to the normalized voltage exceeding a diagnostic activation threshold, determine a first number of instances of a range between successive extremas of the normalized voltage exceeding a loss of isolation range threshold over a diagnostic window of time after detecting the normalized voltage exceeding the diagnostic activation threshold, and automatically initiate a remedial action when the first number is greater than a loss of isolation detection threshold.

In one or more implementations, the vehicle system includes an output device coupled to the control module, wherein the remedial action involves the monitoring service providing a user notification via the output device. In one or more implementations, the output device is a dashboard indicator and the user notification is realized as illumination or activation of the dashboard indicator.

In one or more implementations, the vehicle system includes an energy source coupled to the DC voltage bus, wherein the DC voltage is an output voltage associated with the energy source.

BRIEF DESCRIPTION OF THE DRAWINGS

The exemplary aspects will hereinafter be described in conjunction with the following drawing figures, wherein like numerals denote like elements, and wherein.

DETAILED DESCRIPTION

The following detailed description is merely exemplary in nature and is not intended to limit the application and uses. Furthermore, there is no intention to be bound by any expressed or implied theory presented in the preceding introduction, summary, or the following detailed description. As used herein, the term module refers to any hardware, software, firmware, electronic control component, processing logic, and/or processor device, individually or in any combination, including without limitation: application specific integrated circuit (ASIC), an electronic circuit, a processor (shared, dedicated, or group) and memory that executes one or more software or firmware programs, a combinational logic circuit, and/or other suitable components that provide the described functionality.

Figure 1:
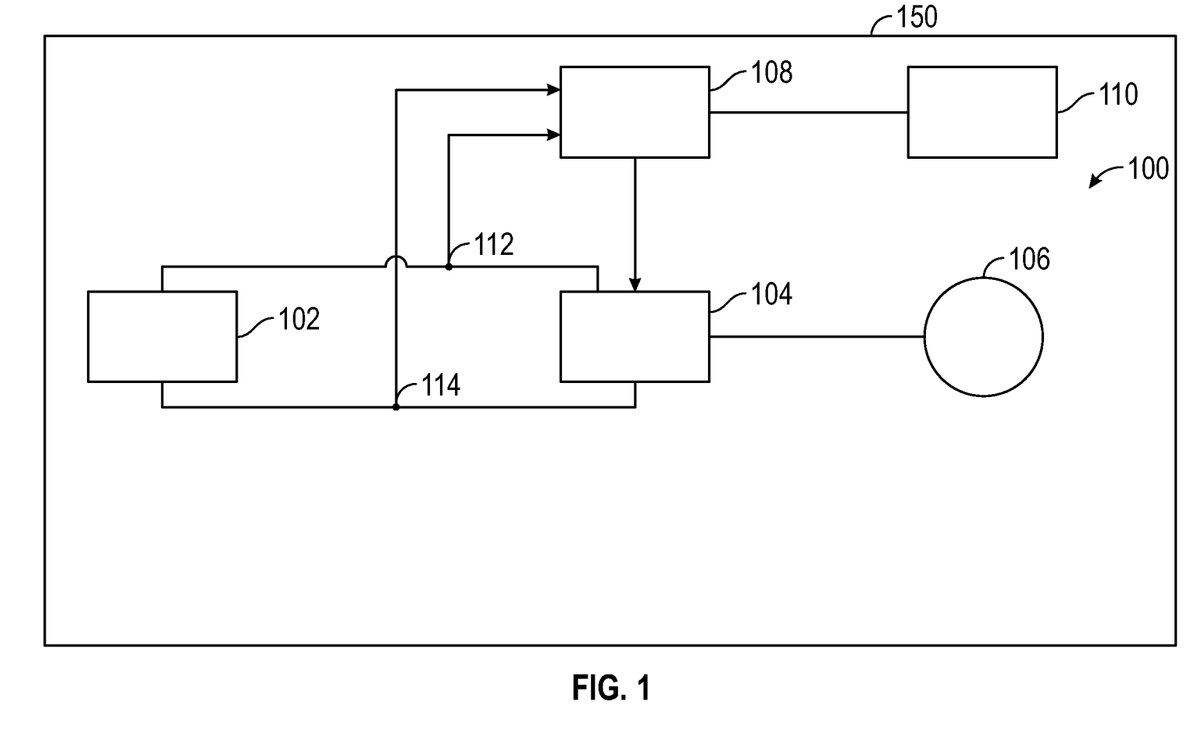
FIG. 1 is a block diagram illustrating an electrical system suitable for use with a vehicle that is configurable to support a monitoring service that detects a loss of isolation on an alternating current (AC) side of the electrical system in accordance with various implementations.

FIG. 1 depicts an exemplary implementation of an electrical system 100 suitable for use in an automotive vehicle 150. The illustrated electrical system 100 includes, without limitation, an energy source 102, a power conversion module 104, an electric motor 106, a control module 108, and at least one output device 110. In the illustrated implementation, the control module 108 is coupled to the power conversion module 104 and generates commands for operating the power conversion module 104 in a manner that results in the desired operation of the electric motor 106 in response to commands received from the driver of the vehicle 150 (e.g., via an accelerator pedal, brake pedal, cruise control system, collision avoidance system, etc.). In exemplary implementations, voltage sensors are coupled to respective nodes 112, 114 corresponding to the respective power supply rails of a direct current (DC) voltage bus used to provide electrical power from the energy source 102 to the power conversion module 104 to obtain voltage measurements associated with the respective voltage nodes 112, 114 indicative of the voltage input to the power conversion module 104. As described in greater detail below, in exemplary implementations, a loss of isolation (LOI) monitoring service at the control module 108 monitors the respective voltages of the nodes 112, 114 referenced to the chassis or other ground voltage to detect and diagnose an alternating current (AC) loss of isolation (ACLOI) at the electric motor 106 or otherwise between the power conversion module 104 and the electric motor 106 on the AC side of the electrical system 100.

The energy source 102 (or power source) generally represents the component in the vehicle 150 that is capable of providing a direct current (DC) voltage to the power conversion module 104 for operating the electric motor 106. Depending on the implementation, the energy source 102 may be realized as a battery, a fuel cell, a rechargeable high-voltage battery pack, an ultracapacitor, or another suitable energy source known in the art. In yet other implementations, the energy source 102 may be realized as the output of a DC-to-DC converter, rectifier, voltage regulator, or other electrical circuit, module or component that receives input power from another source. That said, in exemplary implementations, the energy source 102 is realized as one or more rechargeable batteries configured to provide the desired DC voltage for operating the electric motor 106.

The power conversion module 104 generally represents the component in the vehicle 150 that is coupled between the energy source 102 and the electric motor 106 to convert the DC power from the energy source 102 into alternating current (AC) power for driving the electric motor 106. In this regard, in exemplary implementations, the power conversion module 104 is realized as a power inverter having one or more phase legs, with each phase leg corresponding to a respective phase of the electric motor 106. Generally, switches of a phase leg are modulated (opened or closed) at a particular switching frequency and duty cycle to produce an AC voltage across its associated phase of stator windings of the electric motor 106, which, in turn, creates torque-producing current in those stator windings and operates the electric motor 106. For purposes of explanation, but without limitation, the power conversion module 104 may alternatively be referred to herein as an inverter module or a power inverter; however, the subject matter described herein is not necessarily limited to DC-to-AC power converters.

In one exemplary implementation, the electric motor 106 is realized as an induction motor, however, the subject matter described herein should not be construed as being limited to use with any particular type of electric motor. In other implementations, the electric motor 106 may be realized as an internal permanent magnet (IPM) motor, a synchronous reluctance motor, or another suitable motor known in the art. Although not illustrated in FIG. 1, the motor 106 may include a transmission integrated therein such that the motor 106 and the transmission are mechanically coupled to at least some of the wheels of the vehicle 150 through one or more drive shafts, so that the speed of the motor 106 (e.g., the rotational velocity of the rotor) influences the speed of the vehicle 150.

In exemplary implementations, the vehicle 150 is realized as an automobile, and depending on the implementation, the vehicle 150 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). In exemplary implementations, the vehicle 150 is realized as a fully electric vehicle, a plug-in hybrid vehicle, or the like. However, in various implementations, the vehicle 150 may be realized as a fuel cell vehicle (FCV) or another suitable alternative fuel vehicle, and/or the vehicle 150 may also incorporate any one of, or combination of, a number of different types of engines, such as, for example, a gasoline or diesel fueled combustion engine, a "flex fuel vehicle" (FFV) engine (i.e., using a mixture of gasoline and alcohol), a gaseous compound (e.g., hydrogen, natural gas, propane, etc.) fueled engine, and/or a combustion/electric motor hybrid engine.

In exemplary implementations, the output device 110 generally represents a component associated with the vehicle 150 that is capable of providing one or more user notifications or alerts to a driver or other user associated with the vehicle 150. For example, in some implementations, the output device 110 may include or otherwise be realized as one or more lights, indicators, or other elements on a dashboard of the vehicle 150. In other implementations, the output device 110 may be realized as an electronic display device that is located onboard the vehicle 150 or otherwise associated with another system onboard the vehicle 150, such as, for example, any sort of infotainment module, navigation head unit, or another similar or suitable unit that resides onboard the vehicle 150, which may be integrated into a dashboard or other console within a passenger compartment of the vehicle 150. That said, in yet other implementations, the output device 110 could be realized as an electronic device associated with a vehicle owner or other user associated with the vehicle 150 that is separate and distinct from the vehicle 150 but communicatively coupled to the control module 108 over a communications network, such as, for example, a smartphone, a mobile computer (e.g., a tablet computer, a laptop computer, or a netbook computer), a wearable computing device (e.g., smart watch, smart glasses, smart clothing), or the like.

Still referring to FIG. 1, the control module 108 generally represents the hardware, firmware, software and/or other components of the electrical system 100 that is suitably configured to operate the power conversion module 104 to provide electrical power to the electric motor 106 while concurrently monitoring the voltages of the respective DC voltage bus nodes 112, 114 to detect a loss of isolation on the AC side of the electrical system 100 (e.g., at the electric motor 106 or between the power conversion module 104 and the electric motor 106). Depending on the implementation, the control module 108 can include or be realized as any custom made or commercially available processor, a central processing unit (CPU), a graphics processing unit (GPU), an auxiliary processor among several processors associated with the control module 108, a semiconductor-based microprocessor (in the form of a microchip or chip set), any combination thereof, or generally any device for executing instructions. In practice, the control module 108 may include processing logic that is configurable to carry out the functions, techniques, and processing tasks associated with the operation of the vehicle electrical system 100, as described in greater detail below.

In exemplary implementations, the steps of a method or algorithm described in connection with the implementations disclosed herein may be embodied directly in hardware, in firmware, in a software module executed by the control module 108, or in any practical combination thereof. In exemplary implementations, the control module 108 includes or otherwise accesses a data storage element, memory, or any other short or long term storage media or other suitable non-transitory computer-readable device or media capable of storing programming instructions for execution by the control module 108, which may include volatile and nonvolatile storage in read-only memory (ROM), random-access memory (RAM), keep-alive memory (KAM), flash memory, registers, hard disks, removable disks, magnetic or optical mass storage and/or the like. The computer-executable programming instructions, when read and executed by the control module 108, cause the control module 108 to execute, support, generate or otherwise provide a monitoring service that monitors the voltages at the DC voltage bus nodes 112, 114 to detect an AC loss of isolation and perform various tasks, operations, functions, and processes described herein.

Figure 2:
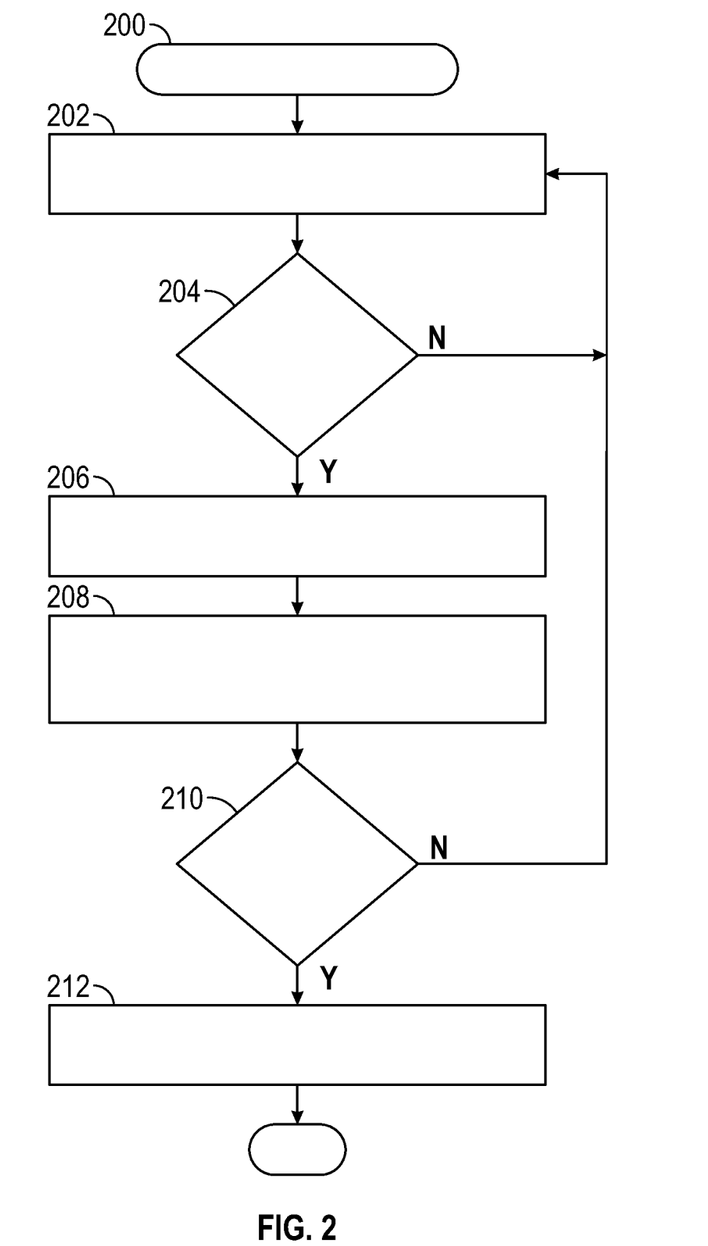
FIG. 2 is a flow diagram illustrating an exemplary loss of isolation (LOI) detection process suitable for implementation by a monitoring service in the vehicle electrical system of FIG. 1 according to one or more implementations described herein.

FIG. 2 depicts an exemplary loss of isolation (LOI) detection process 200 suitable for implementation by monitoring service associated with a control module controlling operation of an electric motor using a power conversion arrangement. For illustrative purposes, the following description may refer to elements mentioned above in connection with FIG. 1. While portions of the LOI detection process 200 may be performed by different elements of a vehicle system, for purposes of explanation, the subject matter may be primarily described herein in the context of LOI detection process 200 being primarily performed by a monitoring service at the control module 108.

The LOI detection process 200 initializes or otherwise begins at 202 by calculating or otherwise determining normalized midpack voltages (measured with respect to the vehicle chassis ground reference voltage) for the positive and negative rails of the DC voltage bus supplying power to the power conversion arrangement and monitoring the normalized midpack voltages to detect when at least one of the normalized midpack voltages satisfies a diagnostic activation threshold for loss of isolation detection at 204. In this regard, the LOI monitoring service at the control module 108 continually monitors the normalized midpack voltages for an excursion out of a normal operating range that is potentially indicative of a loss of isolation on the AC side of the electrical system 100. In exemplary implementations, the LOI monitoring service calculates or otherwise determines a normalized positive midpack voltage by obtaining, from a voltage sensor associated with the DC voltage bus positive reference node 112, a positive reference voltage measurement indicative of the voltage of the DC voltage bus positive reference node 112 relative to the chassis or ground reference voltage, and then dividing the absolute value of the positive reference voltage measurement by the voltage difference between the positive and negative DC voltage bus reference nodes 112, 114 (e.g., the reference DC voltage output by the energy source 102). Thus, the normalized positive midpack voltage may correspond to the relative percentage or distribution of the battery pack voltage that is above (or positive relative to) the chassis or ground voltage. In a similar manner, the normalized negative midpack voltage is calculated by obtaining, from a voltage sensor associated with the DC voltage bus negative reference node 114, a negative reference voltage measurement indicative of the voltage of the DC voltage bus negative reference node 114 relative to the chassis or ground reference voltage, and then dividing the absolute value of the negative reference voltage measurement by the cumulative voltage difference between the positive and negative DC voltage bus reference nodes 112, 114. Accordingly, the normalized negative midpack voltage may correspond to the relative percentage or distribution of the battery pack voltage that is below (or negative relative to) the chassis or ground voltage.

After determining the normalized positive and negative midpack voltages, the LOI detection process 200 compares the normalized midpack voltage values to one or more activation thresholds or other criteria utilized to initiate diagnostic monitoring to confirm whether the excursion or deviation in the normalized midpack voltages is attributable to an ACLOI condition. For example, in one implementation, the LOI detection process 200 monitors the normalized midpack voltages to detect when one of the normalized midpack voltages falls below a lower threshold value of 0.2 (or 20% of the battery pack voltage) or exceeds an upper threshold of 0.8 (or 80% of the battery pack voltage). In this regard, the diagnostics activation threshold(s) may be chosen to accommodate transient fluctuations in voltage due to active isolation or other processes or operations that may cause variations in the relative voltage between the DC voltage bus nodes 112, 114 and the ground or chassis reference voltage node.

In response to detecting a normalized midpack voltage that satisfies a diagnostics activation threshold, the LOI detection process 200 monitors the respective normalized midpack voltages over a diagnostic window of time to identify and extract successive pairs of voltage extremas (cycle maximas or peaks and cycle minimas or valleys) within the diagnostic window at 206. To identify and extract peaks and valleys, the LOI monitoring service at the control module 108 analyzes consecutive samples of the respective voltage nodes 112, 114 to determine whether the difference between samples is greater than a threshold voltage difference (e.g., to mitigate noise), and adds the normalized voltage value to a temporary array or buffer when the difference from the preceding sample in the array is greater than the threshold voltage difference, and discards the normalized voltage sample when the difference is less than the threshold voltage difference. Once the normalized voltage sample values in the temporary array or buffer indicates an extrema or change in the electrical cycle, the LOI monitoring service stores or otherwise maintains that minimum or maximum value as a respective peak or valley extrema within the diagnostic window. For example, in one implementation, the temporary array may be configured to maintain the three most recent normalized voltage samples that exceed the threshold voltage difference relative to the preceding sample, where when the buffered normalized voltage values indicates an extrema and corresponding change in direction of the electrical cycle, the second or middle normalized voltage sample value corresponding to that extrema is then stored or maintained as a respective peak or valley within the diagnostics window. In this manner, the LOI monitoring service at the control module 108 extracts a first set of peak and valley normalized voltage extremas for the positive DC voltage bus reference node 112 and a second set of peak and valley normalized voltage extremas for the DC voltage bus negative reference node 114.

Still referring to FIG. 2, after extracting the normalized voltage extremas for the respective midpack voltages for the positive and negative rails of the DC voltage bus, the LOI detection process 200 calculates or otherwise determines mean and range values for respective peak and valley pairs of extremas within the diagnostic window at 208 and detects occurrence of an ACLOI condition based on the respective mean and range values at 210. In this regard, in exemplary implementations, the LOI detection process 200 performs a rainflow range-mean analysis to determine when to mature the diagnosis of an ACLOI event based on the number of respective range values that exceed an LOI range detection threshold that are greater than a diagnostic threshold. When the number of range values exceeding the LOI range detection threshold within the diagnostic window is less than the diagnostic threshold, the LOI detection process 200 determines a LOI condition does not exist and reverts to monitoring the normalized midpack voltages to reinitiate a subsequent diagnostic window at 202 and 204. In this manner, the LOI detection process 200 avoids false positives or false triggering of LOI notifications due to noise or other transients.

In one or more implementations, for each successive pair of peak and valley normalized voltage extrema values for the DC voltage bus positive reference node 112, the LOI monitoring service at the control module 108 may calculate a respective range value associated with that respective peak and valley pair by subtracting the extracted normalized valley voltage value from the extracted normalized peak voltage value, and calculating a corresponding mean value associated with that respective peak and valley pair by averaging the respective extracted normalized valley voltage value and the respective extracted normalized peak voltage value. In exemplary implementations, the LOI detection process 200 identifies an ACLOI condition by counting the number of respective peak-valley pairs having an associated range value that is greater than an ACLOI range threshold value and detecting the ACLOI condition when the number of respective peak-valley pairs exceeding the ACLOI range threshold value within the diagnostic window is greater than an ACLOI detection threshold. For example, in one implementation, the LOI monitoring service at the control module 108 detects an ACLOI condition when two or more peak-valley pairs associated with a respective DC voltage bus reference node 112, 114 have an associated range value greater than 0.8 (or 80% of the battery pack voltage).

In some implementations, the mean value associated with the respective peak-valley pairs is utilized to verify or otherwise confirm the range values associated with the respective peak-valley pairs is indicative of an LOI condition. For example, when the mean value associated with the respective peak-valley pairs is within an LOI verification threshold of the normalized midpack voltage value of 0.5 (or 50% of the battery pack voltage), then there is no DCLOI detected because the normalized positive and negative midpack voltages are symmetrical about the value of 0.5 during normal conditions. However, the range value associated with the respective peak-valley pair may be considered indicative of an ACLOI condition even if the mean value is consistent with a normal state on the DC side of the electrical system 100 (e.g., where the respective voltages of the positive and negative DC voltage reference nodes are equidistant from a chassis or ground reference voltage node). However, when the mean value associated with the respective peak-valley pairs deviated from the normalized midpack voltage value of 0.5 by more than an LOI verification threshold, the LOI detection process 200 may classify or otherwise characterize the respective peak-valley pair as indicative of a DC loss of isolation (DCLOI) condition and it may fail to increment an ACLOI counter. In this regard, in some implementations, when the number of respective peak-valley pairs having a range value exceeding an ACLOI range threshold value the LOI monitoring service at the control module 108 may detect an AC LOI condition. In this manner, the respective range values associated with respective peak-valley pairs may be utilized to detect an ACLOI condition, and the mean value associated with the respective peak-valley pairs may be utilized to classify the LOI condition as an a DCLOI event.

Still referring to FIG. 2, in exemplary implementations, after detecting an LOI condition, the LOI detection process 200 automatically initiates one or more remedial actions at 212. In one or more implementations, in response to detecting an ACLOI event, the LOI monitoring service at the control module 108 automatically generates or otherwise provides indication of an LOI event, for example, by setting an ACLOI diagnostic flag bit to a value that indicates an ACLOI event or otherwise automatically initiating generation of a maintenance code or diagnostic code associated with the electric motor 106 to provide a corresponding notification to a user via the output device 110 to inspect the electric motor 106 or the AC side of the electrical system 100 during the next maintenance event. Additionally, or alternatively, the LOI monitoring service at the control module 108 may automatically initiate generation of a user notification via the output device 110 that alerts the driver or other operator of the vehicle 150 of a potential maintenance issue (e.g., by illuminating a check engine light or one or more dashboard indicators) to expedite maintenance with respect to the vehicle 150. In some implementations, the LOI monitoring service may also cause the control module 108 to implement an alternative control mode when operating the power conversion module 104 and/or the electric motor 106 to mitigate any potential detrimental effects of an ACLOI condition (e.g., a safe mode, a limp home mode, and/or the like). In this regard, it should be appreciated that there are numerous different potential combinations of remedial actions and corresponding schemes, thresholds and/or logic rules for generating such remedial actions, and the subject matter described herein is not intended to be limited to any particular implementation. Additionally, it should be appreciated that the LOI monitoring service at the control module 108 automatically generates or otherwise provides indication of an LOI event in response to detecting a DCLOI event in a similar manner (e.g., by setting a DCLOI diagnostic flag, generating a DCLOI diagnostic code, etc.).

Figure 3:
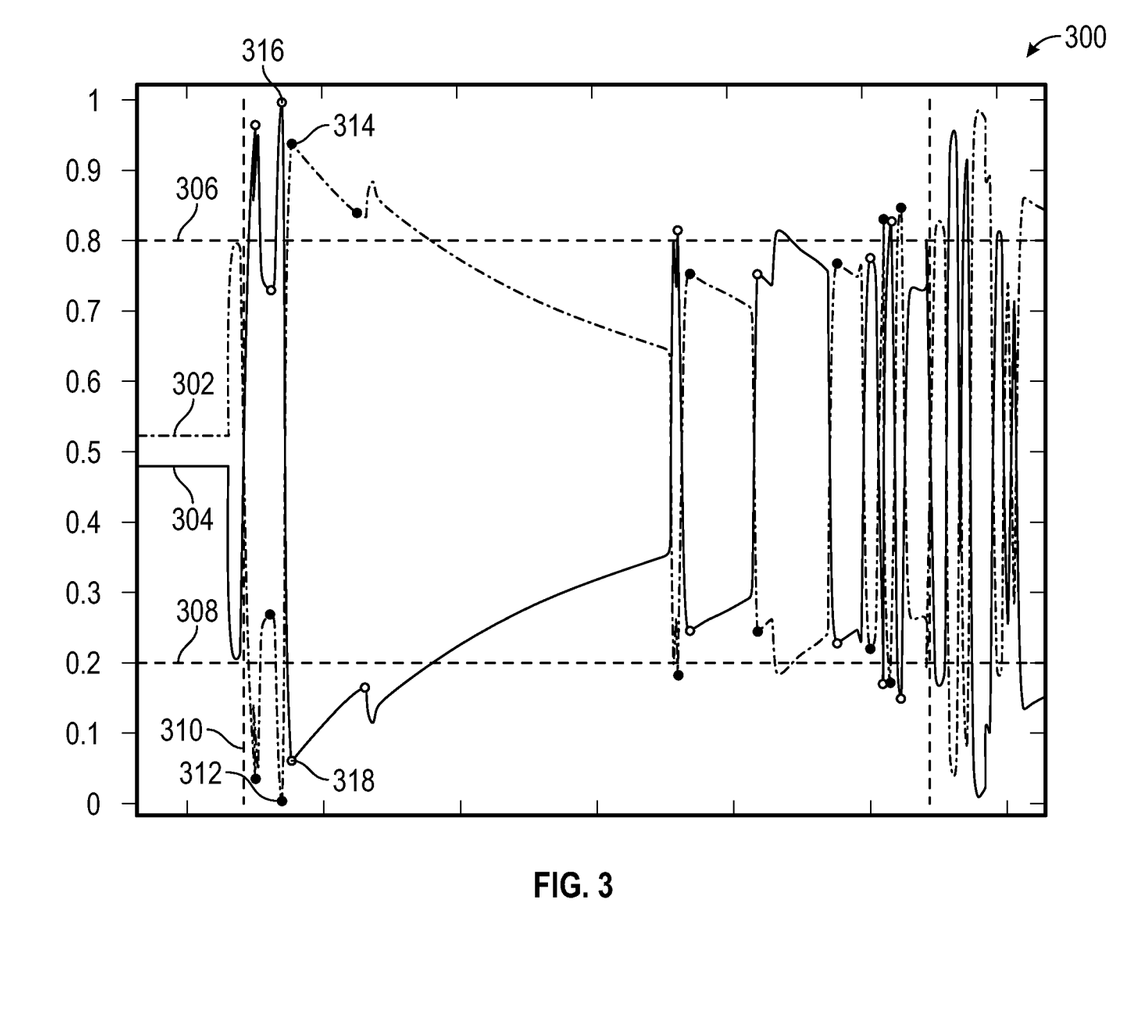
FIG. 3 is a graph depicting normalized midpack voltages in the electrical system of FIG. 1 in connection with an exemplary implementation of the LOI detection process of FIG. 2.

FIG. 3 is a graph 300 depicting a relationship between the normalized positive midpack voltage 302 associated with the DC voltage bus positive reference node 112 and the normalized negative midpack voltage 304 associated with the DC voltage bus negative reference node 114 with respect to time for an exemplary implementation of the LOI detection process 200. When the normalized positive midpack voltage 302 falls below the lower diagnostic activation threshold 308 (e.g., 0.2) and the normalized negative midpack voltage 304 exceeds the upper diagnostic activation threshold 306 (e.g., 0.8) at a point in time 310, the LOI monitoring service at the control module 108 initiates the diagnostic monitoring window (e.g., at 204). Thereafter, the LOI monitoring service at the control module 108 identifies and extracts a valley 312 corresponding to a lower extrema of the normalized positive midpack voltage 302 followed by a peak 314 corresponding to the following upper extrema of the normalized positive midpack voltage 302, and a peak 316 corresponding to an upper extrema of the normalized negative midpack voltage 304 followed by a valley 318 corresponding to the following lower extrema of the normalized negative midpack voltage 304 (e.g., at 206 of the LOI detection process 200). It should be noted that during normal operating conditions, the normalized positive midpack voltage 302 and the normalized negative midpack voltage 304 would be expected to be symmetric with respect to the midpoint or median value of 0.5 in the absence of any LOI condition.

The monitoring service at the control module 108 determines the difference between the peak-valley pair of values 312, 314 associated with the normalized positive midpack voltage 302 (e.g., 0.93) is greater than a ACLOI range threshold value (e.g., 0.8) and increments a ACLOI detection counter (e.g., at 208 of the LOI detection process 200). Similarly, when the difference between the peak-valley pair of values 316, 318 associated with the normalized negative midpack voltage 304 (e.g., 0.93) is greater than a ACLOI range threshold value (e.g., 0.8), the LOI monitoring service at the control module 108 increments the ACLOI detection counter. When the value of the ACLOI detection counter tracking the number of ACLOI range excursion events within the diagnostic window is greater than or equal to the ACLOI detection threshold (e.g., 2), the LOI monitoring service at the control module 108 detects occurrence of an ACLOI event at the time 310 (e.g., at 210 of the LOI detection process 200). In this regard, similarly when the LOI monitoring service verifies that both the mean value of the positive reference DC peak-valley pair 312, 314 and the mean value of the negative reference DC peak-valley pair 316, 318 are within a threshold of the normalized midpack voltage of 0.5, the LOI monitoring service at the control module 108 classifies the LOI event as an DCLOI event and correspondingly initiates one or more remedial actions responsive to the DCLOI event (e.g., at 212 of the LOI detection process 200).

It will be appreciated that the LOI detection process 200 can quickly and accurately diagnose a short circuit or other loss of isolation on the AC side of the electrical system (e.g., at the electric motor 106 or between the power conversion module 104 and the electric motor 106) by monitoring voltage measurements on the DC side of the electrical system 100. By comparing positive-to-chassis and negative-to-chassis midpack voltages with calibratable voltage thresholds and analyzing the ranges and means calculated from extremas of the midpack voltages during a diagnostic window, the LOI detection process 200 is capable of differentiating a true ACLOI event from active isolation or a loss of isolation on the DC side. By reliably diagnosing an ACLOI event, the costs associated with a misdiagnosis or inability to diagnose the problem are reduced. For example, lack of accurate diagnosis of an ACLOI event may lead to false triggering of DC side diagnostic events and undesirable maintenance costs and downtime, such as, for example, replacement or other maintenance performed with respect to the energy source 102, power conversion module 104, or other DC side components (e.g., contactors or other components) when the ACLOI condition or other fault condition actually exists in the electric motor 106 or otherwise on the AC side. Additionally, a driver or other vehicle operator may be notified of the ACLOI event at an earlier stage to allow for remedial actions by the driver or other vehicle operator prior to progression of the ACLOI condition to prolong operation of the vehicle 150.

For sake of brevity, conventional techniques related to vehicle electrical systems, electric motors, power converters, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an implementation of the subject matter.

As used herein, the word "exemplary" means "serving as an example, instance, or illustration." Thus, any implementation described herein as "exemplary" is not necessarily to be construed as preferred or advantageous over other implementations. All of the implementations described herein are exemplary implementations provided to enable persons skilled in the art to make or use the invention and not to limit the scope of the invention which is defined by the claims.

Those of skill in the art will appreciate that the various illustrative logical blocks, modules, circuits, and algorithm steps described in connection with the implementations disclosed herein may be implemented as electronic hardware, computer software, or combinations of both. Some of the implementations are described above in terms of functional and/or logical block components (or modules) and various processing steps. However, it should be appreciated that such block components (or modules) may be realized by any number of hardware, software, and/or firmware components configured to perform the specified functions. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

When implemented in software or firmware, various elements of the systems described herein are essentially the code segments or instructions that perform the various tasks. The program or code segments can be stored in a processor-readable medium or transmitted by a computer data signal embodied in a carrier wave over a transmission medium or communication path. The "computer-readable medium", "processor-readable medium", or "machine-readable medium" may include any medium that can store or transfer information. Examples of the processor-readable medium include an electronic circuit, a semiconductor memory device, a ROM, a flash memory, an erasable ROM (EROM), a floppy diskette, a CD-ROM, an optical disk, a hard disk, a fiber optic medium, a radio frequency (RF) link, or the like. The computer data signal may include any signal that can propagate over a transmission medium such as electronic network channels, optical fibers, air, electromagnetic paths, or RF links. The code segments may be downloaded via computer networks such as the Internet, an intranet, a LAN, or the like.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is logically coherent.

Furthermore, the foregoing description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. For example, two elements may be coupled to each other physically, electronically, logically, or in any other manner, through one or more additional elements. Thus, although the drawings may depict one exemplary arrangement of elements directly connected to one another, additional intervening elements, devices, features, or components may be present in an implementation of the depicted subject matter. In addition, certain terminology may also be used herein for the purpose of reference only, and thus are not intended to be limiting.

While at least one exemplary aspect has been presented in the foregoing detailed description, it should be appreciated that a vast number of variations exist. It should also be appreciated that the exemplary aspect or exemplary aspects are only examples, and are not intended to limit the scope, applicability, or configuration of the disclosure in any way. Rather, the foregoing detailed description will provide those skilled in the art with a convenient road map for implementing the exemplary aspect or exemplary aspects. It should be understood that various changes can be made in the function and arrangement of elements without departing from the scope of the disclosure as set forth in the appended claims and the legal equivalents thereof.

What is claimed is:

1. A method of monitoring an electric motor in a vehicle, the method comprising:
 monitoring, by a control module, a normalized voltage to a power conversion module coupled to the electric motor;
 detecting that the normalized voltage exceeds a diagnostic activation threshold;
 in response to the normalized voltage exceeding the diagnostic activation threshold, determining a first number of instances of a range between successive extremas of the normalized voltage exceeding a loss of isolation range threshold over a diagnostic window of time after detecting the normalized voltage exceeding the diagnostic activation threshold; and
 automatically initiating a remedial action when the first number of instances of the range is greater than a loss of isolation detection threshold by automatically generating a diagnostic code associated with the electric motor.

2. The method of claim 1, further comprising detecting an alternating current (AC) loss of isolation event after verifying a respective mean value associated with a respective instance of the successive extremas of the normalized voltage is within a threshold of a normalized voltage value, wherein automatically initiating the remedial action further comprises automatically providing an indication of the AC loss of isolation event.

3. The method of claim 2, wherein the automatically providing the indication comprises the control module automatically generating a notification to a user via an output device to inspect the electric motor during a next maintenance event.

4. The method of claim 1, further comprising detecting a direct current (DC) loss of isolation event when a difference between a respective mean value associated with a respective instance of the successive extremas of the normalized voltage and a normalized voltage value is greater than a threshold, wherein automatically initiating the remedial action further comprises automatically providing an indication of the DC loss of isolation event.

5. The method of claim 1, wherein monitoring the normalized voltage comprises:
 obtaining a measured voltage for a reference node associated with a voltage bus coupled between an energy source and the power conversion module relative to a ground reference node; and
 dividing the measured voltage by a direct current (DC) voltage associated with the energy source to obtain the normalized voltage.

6. The method of claim 1, further comprising extracting the instances of the successive extremas of the normalized voltage during the diagnostic window of time, wherein a respective instance of the successive extremas comprises a respective maxima of the normalized voltage and a respective minima of the normalized voltage.

7. The method of claim 6, further comprising subtracting the respective minima of the normalized voltage from the respective maxima of the normalized voltage to obtain a respective range value associated with the respective instance of the successive extremas, wherein determining the first number of instances comprises incrementing a counter when the respective range value is greater than the loss of isolation range threshold.

8. The method of claim 7, wherein automatically initiating the remedial action comprises automatically initiating the remedial action when a value of the counter is greater than the loss of isolation detection threshold.

9. The method of claim 1, wherein monitoring the normalized voltage comprises:
 determining a midpack voltage between a node of a voltage bus coupled between an energy source and the power conversion module and a vehicle chassis ground reference voltage node;
 dividing the midpack voltage by a direct current (DC) voltage associated with the energy source to obtain a normalized midpack voltage; and
 monitoring the normalized midpack voltage.

10. The method of claim 9, wherein determining the first number of instances comprises counting the first number of instances when the range between a respective pair of peak and valley values for the normalized midpack voltage is greater than the loss of isolation range threshold within the diagnostic window of time.

11. The method of claim 10, wherein automatically initiating the remedial action comprises automatically providing an indication of an alternating current (AC) loss of isolation event when the first number of instances of the range between respective pairs of peak and valley values for the normalized midpack voltage is greater than the loss of isolation range threshold within the diagnostic window of time is greater than an AC loss of isolation detection threshold number.

12. The non-transitory computer-readable medium of claim 11, wherein the monitoring service is configurable to extract the instances of the successive extremas of the normalized voltage during the diagnostic window of time, wherein a respective instance of the successive extremas comprises a respective maxima of the normalized voltage and a respective minima of the normalized voltage.

13. The non-transitory computer-readable medium of claim 12, wherein the monitoring service is configurable to subtract the respective minima of the normalized voltage from the respective maxima of the normalized voltage to obtain a respective range value associated with the respective instance of the successive extremas, wherein determining the first number of instances comprises incrementing a counter when the respective range value is greater than the loss of isolation range threshold.

14. A non-transitory computer-readable medium comprising executable instructions that, when executed by a processor, cause the processor to provide a monitoring service configurable to:
 monitor a normalized voltage to a power conversion module coupled to an electric motor of a vehicle;
 detect that the normalized voltage exceeds a diagnostic activation threshold;
 in response to the normalized voltage exceeding the diagnostic activation threshold, determine a first number of instances of a range between successive extremas of the normalized voltage exceeding a loss of isolation range threshold over a diagnostic window of time after detecting the normalized voltage exceeding the diagnostic activation threshold; and
 automatically initiate a remedial action when the first number of instances of the range is greater than a loss of isolation detection threshold by automatically generating a diagnostic code associated with the electric motor.

15. The non-transitory computer-readable medium of claim 14, wherein the monitoring service is configurable to detect an alternating current (AC) loss of isolation event after verifying a respective mean value associated with a respective instance of the successive extremas of the normalized voltage is within a threshold of a normalized voltage value, wherein automatically initiating the remedial action further comprises automatically providing an indication of the AC loss of isolation event.

16. The non-transitory computer-readable medium of claim 14, wherein the monitoring service is configurable to detect a direct current (DC) loss of isolation event when a respective mean value associated with a respective instance of the successive extremas of the normalized voltage is greater than a normalized voltage value by more than a threshold, wherein automatically initiating the remedial action further comprises automatically providing an indication of the DC loss of isolation event.

17. A vehicle system including:
an electric motor;
a direct current (DC) voltage bus comprising a reference voltage node;
a power conversion module coupled between the DC voltage bus and the electric motor; and
a control module coupled to the power conversion module to provide a monitoring service configurable to:
monitor a normalized voltage to the power conversion module comprising a relationship between a measured voltage of the reference voltage node and a DC voltage associated with the DC voltage bus;
detect that the normalized voltage exceeds a diagnostic activation threshold;
in response to the normalized voltage exceeding the diagnostic activation threshold, determine a first number of instances of a range between successive extremas of the normalized voltage exceeding a loss of isolation range threshold over a diagnostic window of time after detecting the normalized voltage exceeding the diagnostic activation threshold; and
automatically initiate a remedial action when the first number of instances of the range is greater than a loss of isolation detection threshold by automatically generating a diagnostic code associated with the electric motor.

18. The vehicle system of claim 17, further comprising an output device coupled to the control module, wherein the remedial action further comprises the monitoring service providing a user notification via the output device.

19. The vehicle system of claim 18, wherein the output device comprises a dashboard indicator and the user notification comprises illumination or activation of the dashboard indicator.

20. The vehicle system of claim 17, further comprising an energy source coupled to the DC voltage bus, wherein the DC voltage comprises an output voltage associated with the energy source.

* * * * *